(12) United States Patent
Foster, Sr. et al.

(10) Patent No.: US 8,823,162 B2
(45) Date of Patent: Sep. 2, 2014

(54) INTEGRATED CIRCUIT DIE STACKS WITH TRANSLATIONALLY COMPATIBLE VIAS

(75) Inventors: Jimmy G. Foster, Sr., Morrisville, NC (US); Kyu-Hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/462,994

(22) Filed: May 3, 2012

(65) Prior Publication Data
US 2012/0218024 A1 Aug. 30, 2012

Related U.S. Application Data

(63) Continuation of application No. 12/617,169, filed on Nov. 12, 2009, now Pat. No. 8,258,619.

(51) Int. Cl.
*H01L 23/04* (2006.01)
(52) U.S. Cl.
USPC ........... 257/698; 257/684; 257/685; 257/700; 257/758; 257/777; 438/652
(58) Field of Classification Search
None
See application file for complete search history.

(56) References Cited

U.S. PATENT DOCUMENTS

| | | | |
|---|---|---|---|
| 4,131,516 A | 12/1978 | Bakos et al. | |
| 4,733,461 A | 3/1988 | Nakano | |
| 5,296,686 A | 3/1994 | Bourdelaise et al. | |
| 5,452,178 A | 9/1995 | Emesh et al. | |
| 5,839,184 A | 11/1998 | Ho et al. | |
| 5,963,464 A | 10/1999 | Dell et al. | |
| 5,967,799 A | 10/1999 | Arai | |
| 5,998,259 A | 12/1999 | Chuang | |
| 6,194,774 B1 | 2/2001 | Cheon | |

(Continued)

FOREIGN PATENT DOCUMENTS

| EP | 0213205 A1 | 11/1987 |
|---|---|---|
| EP | 1202296 A1 | 2/2002 |

(Continued)

OTHER PUBLICATIONS

Breed, "Analyzing Signals Using the Eye Diagram", Nov. 2005, High Frequency Electronics, vol. 4 No. 11, pp. 50, 52, 53.

(Continued)

*Primary Examiner* — Tan N Tran
*Assistant Examiner* — Scott R Wilson
(74) *Attorney, Agent, or Firm* — Edward J. Lenart; Katherine S. Brown; Biggers Kennedy Lenart Spraggins LLP (57) ABSTRACT

An integrated circuit die stack including a first integrated circuit die mounted upon a substrate, the first die including pass-through vias ('PTVs') composed of conductive pathways through the first die with no connection to any circuitry on the first die; and a second integrated circuit die, identical to the first die, shifted in position with respect to the first die and mounted upon the first die, with the PTVs in the first die connecting signal lines from the substrate through the first die to through silicon vias ('TSVs') in the second die composed of conductive pathways through the second die connected to electronic circuitry on the second die; with the TSVs and PTVs disposed upon each identical die so that the positions of the TSVs and PTVs on each identical die are translationally compatible with respect to the TSVs and PTVs on the other identical die.

18 Claims, 8 Drawing Sheets

(56) References Cited

U.S. PATENT DOCUMENTS

| | | |
|---|---|---|
| 6,197,181 B1 | 3/2001 | Chen |
| 6,208,225 B1 | 3/2001 | Miller |
| 6,290,833 B1 | 9/2001 | Chen |
| 6,300,578 B1 | 10/2001 | Hoffmeyer et al. |
| 6,376,914 B2 * | 4/2002 | Kovats et al. ............ 257/777 |
| 6,404,001 B2 | 6/2002 | Koo et al. |
| 6,512,285 B1 | 1/2003 | Hashemi et al. |
| 6,541,712 B1 | 4/2003 | Gately et al. |
| 6,621,012 B2 | 9/2003 | Crockett et al. |
| 6,638,410 B2 | 10/2003 | Chen et al. |
| 6,646,520 B2 | 11/2003 | Miller |
| 6,653,170 B1 | 11/2003 | Lin |
| 6,678,145 B2 | 1/2004 | Naito et al. |
| 6,680,659 B2 | 1/2004 | Miller |
| 6,717,071 B2 | 4/2004 | Chang et al. |
| 6,775,901 B1 | 8/2004 | Lee et al. |
| 6,803,665 B1 | 10/2004 | Megahed et al. |
| 6,822,529 B2 | 11/2004 | Miller |
| 6,853,003 B2 | 2/2005 | Lee |
| 6,913,471 B2 | 7/2005 | Smith |
| 6,927,481 B2 | 8/2005 | Gibson et al. |
| 6,958,547 B2 | 10/2005 | Dubin et al. |
| 6,983,535 B2 | 1/2006 | Crockett et al. |
| 7,005,721 B2 | 2/2006 | Nishijima |
| 7,030,712 B2 | 4/2006 | Brunette et al. |
| 7,118,985 B2 | 10/2006 | Allman et al. |
| 7,123,497 B2 | 10/2006 | Matsui et al. |
| 7,154,356 B2 | 12/2006 | Brunette et al. |
| 7,186,919 B2 | 3/2007 | Kim et al. |
| 7,204,648 B2 | 4/2007 | Aronson |
| 7,227,240 B2 | 6/2007 | Knapp et al. |
| 7,249,337 B2 | 7/2007 | Gisin et al. |
| 7,277,005 B2 | 10/2007 | Kang et al. |
| 7,342,300 B2 | 3/2008 | Wight et al. |
| 7,916,511 B2 | 3/2011 | Park |
| 8,064,222 B2 | 11/2011 | Nishio et al. |
| 2002/0191366 A1 | 12/2002 | Naito et al. |
| 2002/0195271 A1 | 12/2002 | Gailus |
| 2003/0137042 A1 * | 7/2003 | Mess et al. ............ 257/686 |
| 2004/0232559 A1 | 11/2004 | Adelmann |
| 2005/0010725 A1 * | 1/2005 | Eilert ............ 711/132 |
| 2005/0062556 A1 | 3/2005 | Aronson |
| 2005/0082664 A1 | 4/2005 | Funaba et al. |
| 2005/0178669 A1 | 8/2005 | Strubbe |
| 2005/0184825 A1 | 8/2005 | Oran |
| 2005/0233501 A1 | 10/2005 | Nose et al. |
| 2007/0096332 A1 | 5/2007 | Satoh et al. |
| 2007/0103251 A1 | 5/2007 | Fan et al. |
| 2007/0117348 A1 | 5/2007 | Ramanathan et al. |
| 2008/0054428 A1 | 3/2008 | Lam |
| 2009/0049414 A1 | 2/2009 | Mutnury et al. |
| 2010/0124035 A1 | 5/2010 | Bandholz et al. |
| 2011/0073359 A1 | 3/2011 | Cases et al. |
| 2011/0108972 A1 | 5/2011 | Foster et al. |
| 2011/0109381 A1 | 5/2011 | Foster, Sr. et al. |
| 2011/0110064 A1 | 5/2011 | Foster, Sr. et al. |
| 2011/0110065 A1 | 5/2011 | Foster, Sr. et al. |
| 2011/0148543 A1 | 6/2011 | Bandholz et al. |
| 2011/0312129 A1 * | 12/2011 | Joseph et al. ............ 438/107 |
| 2011/0317387 A1 | 12/2011 | Pan et al. |
| 2012/0069537 A1 | 3/2012 | Rofougaran |
| 2012/0162947 A1 | 6/2012 | O'Donnell et al. |
| 2012/0286431 A1 | 11/2012 | Foster, Sr. et al. |
| 2012/0299640 A1 | 11/2012 | Foster, Sr. et al. |
| 2013/0214855 A1 | 8/2013 | Foster, SR. et al. |

FOREIGN PATENT DOCUMENTS

| | | |
|---|---|---|
| JP | 6140451 A | 5/1994 |
| JP | 2000031651 A | 1/2000 |
| JP | 2008028188 | 2/2008 |
| KR | 20030084355 | 11/2003 |
| WO | WO2004/025695 A2 | 3/2004 |

OTHER PUBLICATIONS

Office Action, U.S. Appl. No. 12/616,563, Aug. 6, 2012.
Office Action, U.S. Appl. No. 12/644,704, Aug. 31, 2012.
Anonymous; Method for a Cylindrical Chip Capacitor; IP.com Prior Art Database Technical Disclosure; Mar. 16, 2005; pp. 1-10, IP.com.
Office Action, U.S. Appl. No. 12/617,169, Feb. 17, 2012, pp. 1-18.
Notice of Allowance, U.S. Appl. No. 12/617,169, Apr. 27, 2012, pp. 1-7.
Office Action, U.S. Appl. No. 12/274,407, May 24, 2011, pp. 1-9.
Notice of Allowance, U.S. Appl. No. 12/274,407, Sep. 29, 2011, pp. 1-12.
Office Action, U.S. Appl. No. 12/570,029, Oct. 20, 2011, pp. 1-9.
Office Action, U.S. Appl. No. 12/570,029, Dec. 15, 2011, pp. 1-11.
Notice of Allowance, U.S. Appl. No. 12/570,029, Apr. 6, 2012, pp. 1-8.
Office Action, U.S. Appl. No. 12/616,912, Feb. 3, 2012, pp. 1-10.
Office Action, U.S. Appl. No. 12/616,912, May 31, 2012, pp. 1-6.
Notice of Allowance, U.S. Appl. No. 12/616,912, Jul. 10, 2012, pp. 1-11.
Office Action, U.S. Appl. No. 12/617,273, Feb. 3, 2012, pp. 1-10.
Office Action, U.S. Appl. No. 12/617,273, May 31, 2012, pp. 1-7.
Notice of Allowance, U.S. Appl. No. 12/617,273, Jul. 9, 2012, pp. 1-10.
Office Action, U.S. Appl. No. 12/644,704, Apr. 3, 2012, pp. 1-6.
Black et al., "Die Stacking (3D) Microarchitecture", Proceedings of the 39$^{th}$ International Symposium on Microarchitecture, Dec. 2006, pp. 469-479, IEEE Computer Society, Washington, DC, USA.

* cited by examiner

Transmit An Alternating Current Signal From A Substrate 302

Transmit The Signal Through A First Substack Mounted Upon The Substrate To Electronic Circuitry In A Second Substack In The Die Stack, The First Substack Comprising Two Or More Identical Dies, Each Of The Dies In The First Substack Stacked Upon One Another With No Shift In Position With Respect To One Another, The Second Substack Comprising Two Or More Dies Identical To The Dies In The First Substack, Each Of The Dies In The Second Substack Stacked Upon One Another With No Shift In Position With Respect To One Another, The Entire Second Substack Shifted In Position With Respect To The First Substack And Mounted Upon The First Substack So That PTVs In The First Substack Align With TSVs In The Second Substack And Connect The Signal Lines From The Substrate Through The First Substack To TSVs In The Second Substack
314

Conduct The Signal Through PTVs 304

Conduct The Signal By The First Substack Through PTVs In The First Substack, The PTVs Comprising Conductive Pathways Through The First Substack With No Connection To Any Circuitry In The First Substack
316

Conduct The Signal Through TSVs To The Electronic Circuitry 306

Conduct The Signal By The Second Substack Through TSVs In The Second Substack To Electronic Circuitry In The Second Substack, TSVs In The Second Substack Comprising Conductive Pathways Through The Second Substack That Are Also Connected To Electronic Circuitry In The Second Substack
318

INTEGRATED CIRCUIT DIE STACKS WITH TRANSLATIONALLY COMPATIBLE VIAS

CROSS-REFERENCE TO RELATED APPLICATION

This application is a continuation application of and claims priority from U.S. patent application Ser. No. 12/617,169, filed on Nov. 12, 2009.

BACKGROUND OF THE INVENTION

1. Field of the Invention

The field of the invention is design, fabrication, and operation of integrated circuit, or, more specifically, structure and methods of making and operating integrated circuit die stacks with translationally compatible vias.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas of computer technology that sees continual advancement is packaging of integrated circuits. Packaging many integrated circuits into a confined space is becoming more difficult as many devices continue to shrink in size or need to communicate with more chips. An example would be stacking multiple memory chips in one package to provide more locations to store data. Prior art has shown how to stack multiple chips on top of each other with package stacking, one die per package. Other prior art has shown how to stack multiple dies into one package by tying signal lines together between or among dies within the package, for example, wrapping signal lines outside the dies, or placing redistribution layers between the dies. A more recent approach for wafer stacking is to connect the signals together with vias, effectively sending a bus of signal lines vertically through a stack of dies. All of these approaches have the drawback of more heavily loading busses as more dies are stacked reducing signal quality and bus speeds.

SUMMARY OF THE INVENTION

An integrated circuit die stack, including methods of making and operating, including a first integrated circuit die mounted upon a substrate, the first die including pass-through vias ('PTVs'), each PTV composed of a conductive pathway through the first die with no connection to any circuitry on the first die; and a second integrated circuit die, identical to the first die, shifted in position with respect to the first die and mounted upon the first die, with the PTVs in the first die connecting signal lines from the substrate through the first die to through silicon vias ('TSVs') in the second die, each TSV on the second die composed of a conductive pathway through the second die that is also connected to electronic circuitry on the second die; with the TSVs and PTVs disposed upon each identical die so that the positions of the TSVs and PTVs on each identical die are translationally compatible with respect to the TSVs and PTVs on the other identical die.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXAMPLE EMBODIMENTS

Figure 1:
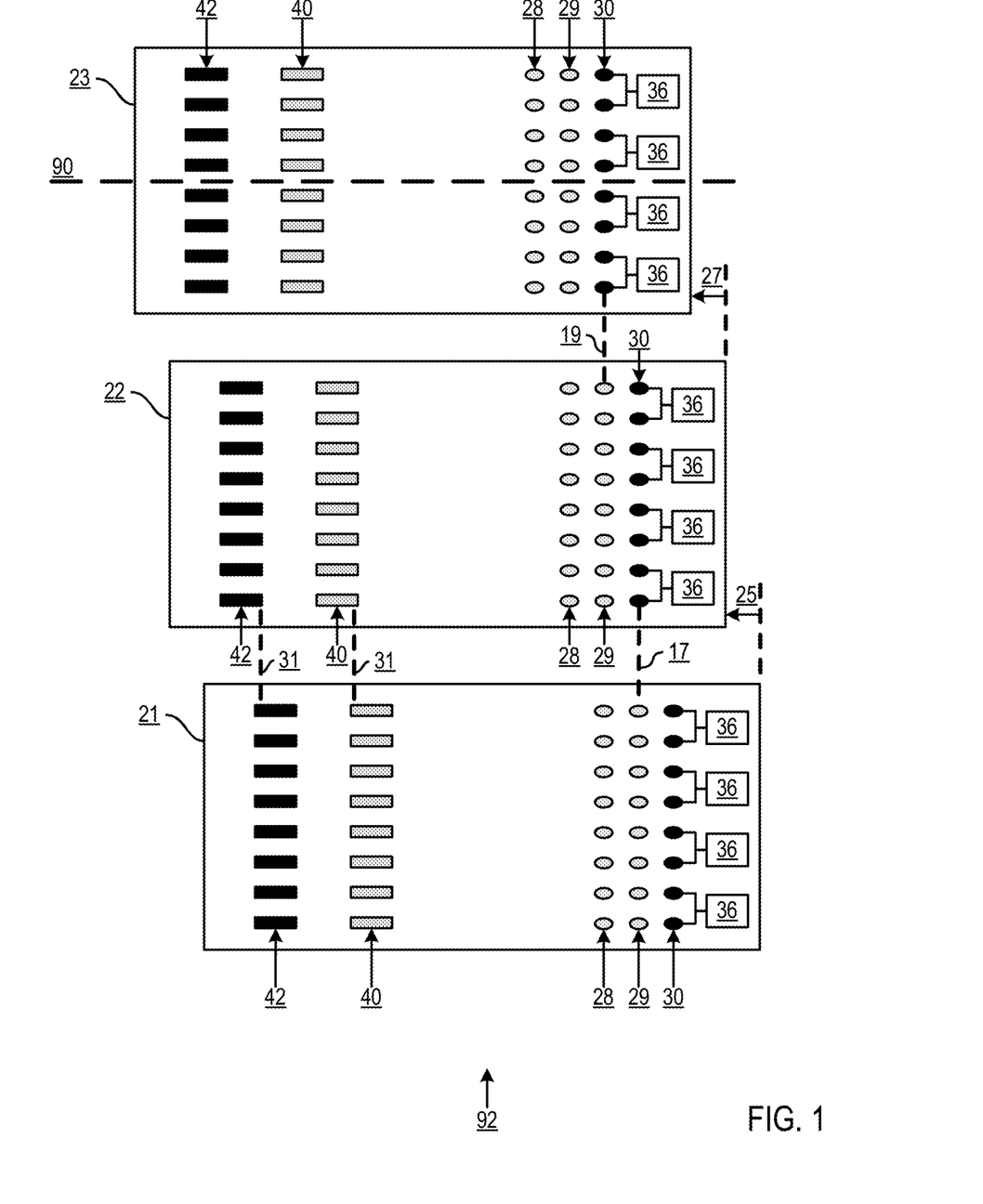
FIG. 1 sets forth a cross-sectional plan view schematic drawing of three example integrated circuit dies of a die stack according to embodiments of the present invention.

Examples of integrated circuit die stacks, methods of manufacturing integrated circuit die stacks, and methods of operation for integrated die stacks according to embodiments of the present invention are described with reference to the accompanying drawings, beginning with FIG. 1. FIG. 1 sets forth a cross-sectional plan view schematic drawing of three example integrated circuit dies (21, 22, 23) of a die stack according to embodiments of the present invention. As an aid to explanation, the dies in the example of FIG. 1 are unstacked, laid beside one another in the plane of the illustration, and shifted in position with respect to one another. The dotted lines and arrows at references (25, 27) illustrated the shifts in position. A die stack can be formed of these dies by mounting die (22) on die (21) and die (23) on die (22), maintaining the shifts in position (25, 27), and then mounting all three dies onto a substrate. The substrate can be a connective layer in a chip package between the die stack and external pins or between flip-chip connectors and the stack. In various embodiments the substrate can be a board, an integrated circuit carrier board, an adapter board, or a motherboard, for example.

Each die in this example includes pass-through vias ('PTVs') (28, 29), conductive pathways through each die with no connections to any circuitry on the die. Each die also includes through silicon vias ('TSVs') (30), conductive pathways through the dies that also connect to electronic circuitry (36) on the die. For ease of explanation, FIG. 1 shows on each die only eight each of the PTVs and TSVs, but readers will recognize that dies in die stacks according to embodiments of the present invention can include any number of PTVs and TSVs as may occur to those of skill in the art, eight, sixteen, thirty-two, sixty-four, for example, and that such aggregations of PTVs and TSVs will often be used to effect connection of bus signals from a substrate up through the die stack to circuitry somewhere in the die stack.

All three dies in the example of FIG. 1 are identical to one another, and the only differences in their appearances as illustrated are their shifts in position (25, 27). The TSVs (30) and PTVs (28, 29) are disposed upon each identical die with the positions of the TSVs and PTVs on each identical die translationally compatible with respect to the TSVs and PTVs on each of the other identical dies. The "translation" element of translational compatibility is used here as in the science of physics to refer to movement that changes the position of an object, as opposed to rotation. In this context, "translationally compatible" means that the PTVs and TSVs are disposed on each identical die so that a first die's shift in position with respect to another die can align PTVs in the first die with TSVs in the second die. In addition, to the extent that an identical die design includes more than one set of PTVs, as is the case in this example, then "translationally compatible" includes PTVs disposed so as to align PTVs across dies with shifts in position. In the particular example of translational compatibility illustrated by the dies of FIG. 1, die (22) is shifted in position (25) with respect to die (21) so that, when die (22) is mounted upon die (21), PTVs (29) in die (21) align (17) with TSVs (30) in die (22), so that the PTVs in die (21) can connect conductors from a substrate through die (21) to the TSVs in die (22)—and therefore to the circuitry (36) in die (22). Similarly, die (23) is shifted in position (27) with respect to die (22) so that, when die (23) is mounted upon die (22), with die (22) mounted below it on die (21) and a substrate, PTVs (29) in die (22) align (19) with TSVs (30) in die (22), so that the PTVs (29) in die (22) can connect conductors from a substrate through die (22) to the TSVs in die (23)—and therefore to the circuitry (36) in die (23). The shift in position (25) of die (22) with respect to die (21), in addition to aligning (17) PTVs (29) of die (21) with TSVs (30) in die (22), also aligns PTVs (28) of die (21) with PTVs (29) of die (22), creating a conductive path from a substrate all the way through dies (21, 22) to the TSVs (30) of die (23).

The dies (21, 22, 23) in the example of FIG. 1 also include power lines (40) and common lines (42), which like the PTVs and the TSVs are also conductive pathways through the dies. In addition, the power lines and common lines, also like the PTVs and TSVs, are disposed on both dies so as to be translational compatible. "Translational compatible," however, has a slightly different meaning in the case of the power and common lines. "Translational compatible" as applied to the TSVs and PTVs means that upon a shift in position of a die, the TSVs on that die align with PTVs on another die, that is, unlike things align. In dies with more than one set of PTVs, a shift in position can also align PTVs across dies, but in translationally compatible dies, a shift in position always aligns unlike things, PTVs with TSVs. In the case of the power and common lines, it is never intended to align unlike things, power lines with common lines. On the contrary, it is intended always to align like things, power lines with power lines, common lines with common lines. So in the case of the power lines and common lines, "translational compatible" means that upon a shift in position of a die with respect to another die, the power lines on the shifted die align with power lines on the other die, and the common lines on the shifted die align with common lines on the other die. In the particular example of FIG. 1, with die (22) shifted in position (25) with respect to die (21), note according to lines (31) that the power lines (40) and the common lines (42) of die (22) align so as to overlap and contact the power lines (40) and common lines (42) of die (21) when die (22) is mounted upon die (21). Similarly, the power lines (40) and common lines (42) of die (23) align so as to overlap and contact the power lines (40) and common lines (42) of die (22) when die (23) is mounted upon die (22). In this way, power and common are conducted from a substrate all the way up through a die stack composed of dies having translationally compatible power and common lines.

Figure 2:
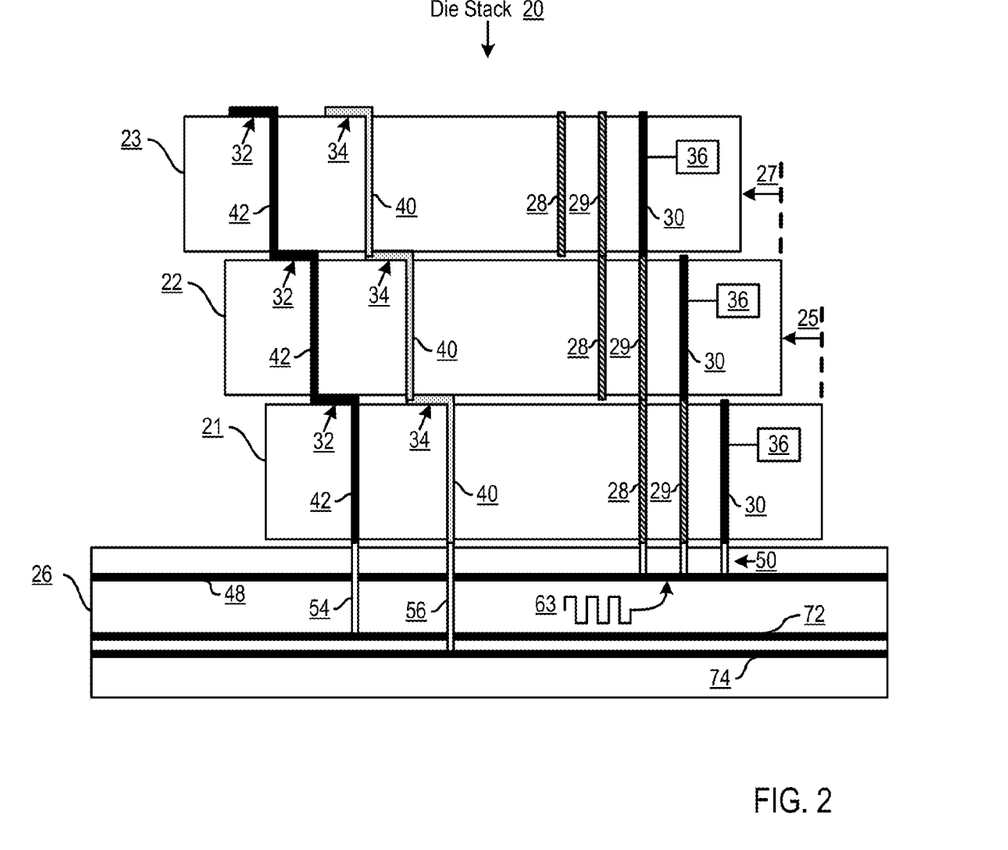
FIG. 2 sets forth a cross-sectional vertical view schematic drawing of an example integrated circuit die stack according to embodiments of the present invention.

For further explanation, FIG. 2 sets forth a cross-sectional vertical view schematic drawing of an example integrated circuit die stack (20) according to embodiments of the present invention. FIG. 2 shows the dies (21, 22, 23) of FIG. 1 stacked upon one another and upon a substrate (26)—with the cross-section of FIG. 2 taken along line (90) on FIG. 1 and viewed from perspective (92) on FIG. 1. The substrate includes conductors represented here as signal lines (48), power lines (74), and common lines (72). The signal lines (48), viewed here as a single horizontal line because of the cross-sectional perspective, in fact represent a plurality of bus conductors, eight (to match the number of TSVs in the dies of FIG. 1), or, alternatively, sixteen, thirty-two, sixty-four, and so on. Regardless of the number of conductors in the bus, bus (48) is a single bus driving three sets of conductors (28, 29, 30) vertically into the die stack (20). Readers will recognize that, as an alternative to the single bus (48) substrate architecture of FIG. 2, the substrate (26) could implement three buses, one each to drive separately the three buses (28, 28, 30) vertically through the die stack (20). The architecture as illustrated presents an engineering challenge to impedance-match a single bus (48) to drive three sets of conductors (28, 29, 30) up into the die stack. A three-bus architecture would ease the impedance matching challenge—although requiring more complexity in the substrate.

Each die in this example includes PTVs (28, 29), conductive pathways through each die with no connections to any circuitry on the die. Each die also includes TSVs (30), again, conductive pathways through the dies that also connect to electronic circuitry (36) on a die. The substrate provides connections (50) from the signal lines (48) in the substrate through TSVs (30) to circuitry (36) on the dies. In addition, the substrate's signal lines connect to the TSVs (30) in the second die (22) through PTVs (29) in the first die (21), and the substrate's signal lines also connect to the TSVs (30) in the third die (23) through PTVs (28) in the first die (21) and through PTVs (28) in the second die (22).

All three dies in the example of FIG. 2 are identical to one another, and the only differences in their appearances as illustrated are their shifts in position (25, 27). The TSVs (30) and PTVs (28, 29) are disposed on each identical die with the positions of the TSVs and PTVs on each identical die translationally compatible with respect to the TSVs and PTVs on each of the other identical dies. Again, the "translation" element of translational compatibility is used here as in the science of physics to refer to movement that changes the position of an object, as opposed to rotation. And "translationally compatible" means that the PTVs and TSVs are disposed on each identical die so that a first die's shift in position with respect to another die can align PTVs in the first die with TSVs in the second die. In addition, to the extent that an identical die design includes more than one set of PTVs, as is the case in this example, then "translationally compatible" includes PTVs disposed so as to align PTVs across dies with shifts in position. In the particular example of translational compatibility illustrated by the dies of FIG. 2, die (22) is shifted in position (25) with respect to die (21) so that, when die (22) is mounted upon die (21), PTVs (29) in die (21) align with TSVs (30) in die (22), so that the PTVs in die (21) can connect conductors (48) from a substrate through die (21) to the TSVs in die (22)—and therefore to the circuitry (36) in die (22). Similarly, die (23) is shifted in position (27) with respect to die (22) so that, when die (23) is mounted upon die (22), with die (22) mounted below it on die (21) and the substrate (26), PTVs (29) in die (22) align with TSVs (30) in die (23), so that the PTVs (29) in die (22) can connect conductors from a substrate through die (22) to the TSVs in die (23)—and therefore to the circuitry (36) in die (23). The shift in position (25) of die (22) with respect to die (21), in addition to aligning PTVs (29) of die (21) with TSVs (30) in die (22), also aligns PTVs (28) of die (21) with PTVs (29) of die (22), creating a conductive path from the substrate (26) all the way through dies (21, 22) to the TSVs (30) of die (23).

The dies (21, 22, 23) in the example of FIG. 2 also include power lines (40) and common lines (42), which like the PTVs and the TSVs are also conductive pathways through the dies. In addition, the power lines and common lines, also like the PTVs and TSVs, are disposed on both dies so as to be translational compatible. In the vertical cross-section of FIG. 2, the power lines (40) and common lines (42) can be seen to include conductive horizontal distribution extensions (32, 34) deposited on the top surface of each die as an aid to translational compatibility of the power lines (40) and common lines (42). "Translational compatible," again, has a slightly different meaning in the case of the power and common lines. "Translational compatible" as applied to the TSVs and PTVs means that upon a shift in position of a die, the TSVs on that die align with PTVs on another die, that is, unlike things align. In dies with more than one set of PTVs, a shift in position can also align PTVs across dies, but in translationally compatible dies, a shift in position always aligns unlike things, PTVs with TSVs. In the case of the power and common lines, it is never intended to align unlike things, power lines with common lines. On the contrary, it is intended always to align like things, power lines with power lines, common lines with common lines. So in the case of the power lines and common lines, "translational compatible" means that upon a shift in position of a die with respect to another die, the power lines on the shifted die align with power lines on the other die, and the common lines on the shifted die align with common lines on the other die. In the particular example of FIG. 2, with die (22) shifted in position (25) with respect to die (21), note according to lines (31) that the power lines (40) and the common lines (42) of die (22) align so as to overlap and contact the power lines (40) and common lines (42) of die (21) when die (22) is mounted upon die (21). Similarly, the power lines (40) and common lines (42) of die (23) align so as to overlap and contact the power lines (40) and common lines (42) of die (22) when die (23) is mounted upon die (22). In this way, power and common are conducted from a substrate all the way up through a die stack composed of dies having translationally compatible power and common lines.

Figure 3:
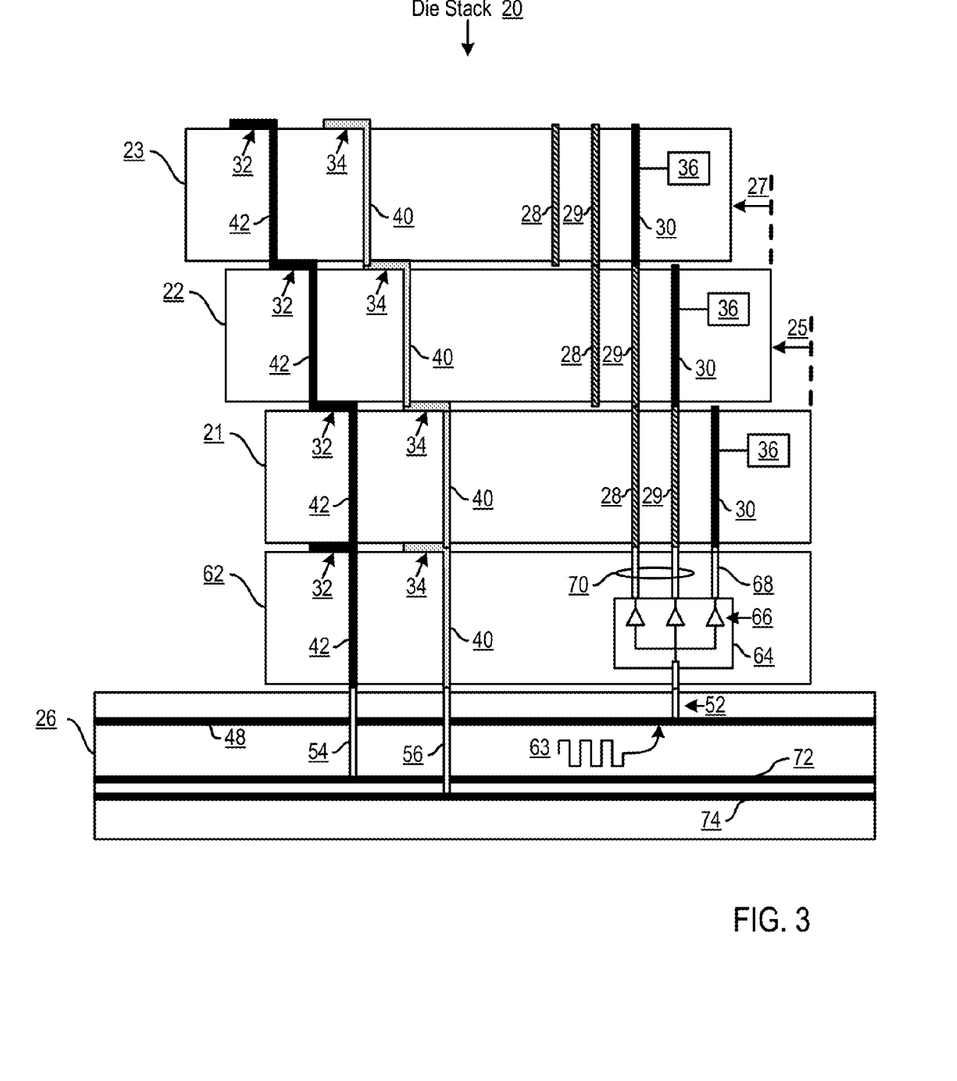
FIGS. 3 and 4 set forth cross-sectional vertical view schematic drawings of further example integrated circuit die stacks according to embodiments of the present invention, where the die stacks include an interface die.

For further explanation, FIG. 3 sets forth a cross-sectional vertical view schematic drawing of a further example integrated circuit die stack according to embodiments of the present invention, where the die stack (20) includes an interface die (62). FIG. 3 shows the dies (21, 22, 23) of FIGS. 1-2 stacked upon a substrate (26) similar to the substrate (26) of FIG. 2—with the cross-section of FIG. 3 taken along line (90) on FIG. 1 and viewed from perspective (92) on FIG. 1. The example die stack of FIG. 3, however, unlike the die stack of FIG. 2, includes an additional die, an interface die (62) mounted upon the substrate (26) between the substrate (26) and the first die (21).

The interface die (62) provides an interface between the other dies (21, 22, 23) in the stack in the sense that the interface die splits and connects a same set of signal lines (48) from the substrate to the PTVs (28, 29) on the first die (21) in the stack and separately to TSVs (30) on the first die (21). The PTVs (29) on the first die (21) then convey signals from the substrate through TSVs (30) of the second die (22) to circuitry (36) on the second die (23)—and the PTVs (28) on the first die (21) convey signals from the substrate through PTVs (29) of the second die (22) and through TSVs (30) of the third die (23) to circuitry (36) on the third die (23). The splitting of signals in the interface die (62) is effected by interface circuitry (64) in the interface die (62). The interface circuitry includes drivers (66) that connect the signal lines (48) from the substrate to signal lines (68, 70) in the interface die. The drivers (66) are depicted pointing up through the stack in a unidirectional manner, but readers will recognize that the interface circuitry (64) can be configured to operate the conductors (52, 68, 70) either unidirectionally or bidirectionally. The signal lines (68) connect driver outputs to TSVs (30) in the first die (21), and the signal lines (70) connect driver outputs to PTVs (28, 29) in the first die (21) and therefore to TSVs (30) in the second die (22), to circuitry (30) in the second die (22), to PTVs (29) in the second die (22), to TSVs (30) in the third die (23), and to circuitry in the third die (23).

In view of this explanation of the example die stack of FIG. 3, readers will recognize that the signal lines (48) of substrate (26) of FIG. 3, with the inclusion of the interface circuitry of the interface die in the die stack, need to drive only a single bus connection (52) into the die stack despite the fact that three buses enter the three identical dies (21, 22, 23) in the stack, an advantage over the design of the substrate of FIG. 2 in which the signal lines (48) were required to drive three sets of bus lines into the die stack, one set of bus lines into the PTVs (28) of die (21), another set of bus lines into the PTVs (29) of die (21), and a third set of bus lines into the TSVs (30) of die (21). It is an engineering tradeoff that requires the addition of an interface die to the stack but substantially eases the design and manufacture of the substrate. It is likely that embodiments with more sets of PTVs and therefore more buses driven into the die stack will tend to prefer the use of an interface die.

Figure 4:
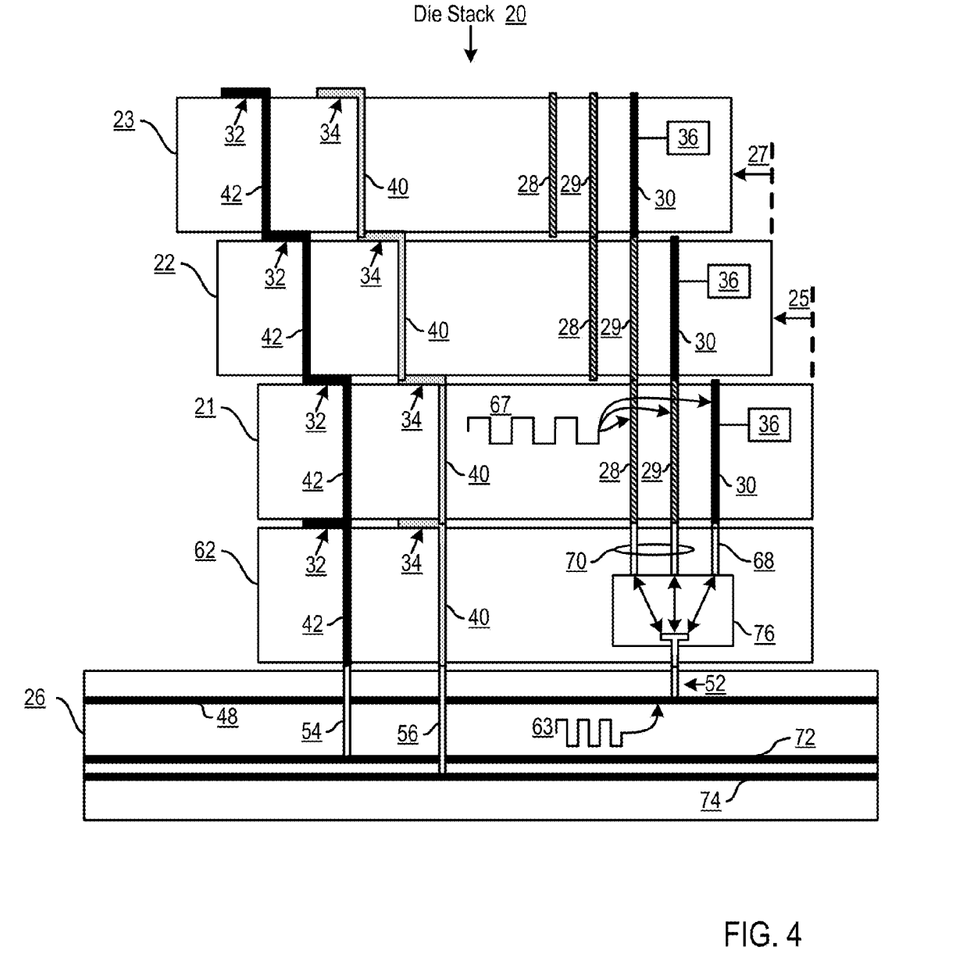

For further explanation, FIG. 4 sets forth a cross-sectional vertical view schematic drawing of a further example integrated circuit die stack according to embodiments of the present invention, where the die stack (20) includes an interface die (62). FIG. 4 shows the dies (21, 22, 23) of FIGS. 1-2 stacked upon a substrate (26) similar to the substrate (26) of FIG. 2—with the cross-section of FIG. 4 taken along line (90) on FIG. 1 and viewed from perspective (92) on FIG. 1. The example die stack of FIG. 4, however, unlike the die stack of FIG. 2, includes an additional die, an interface die (62) mounted upon the substrate (26) between the substrate (26) and the first die (21) in the die stack (20).

The interface die (62) provides an interface between the other dies (21, 22, 23) in the stack in the sense that the interface die multiplexes and demultiplexes the same set of signal lines (48) from the substrate (26) separately to the PTVs (28, 29) on the first die (21) and separately to TSVs (30) on the first die (21). The PTVs (28, 29) on the first die (21) then convey signals from the substrate through TSVs (30) of the second die (22) to circuitry (36) on the second die (22)—and through PTVs (29) of the second die (22) to TSVs (30) of the third die (23) and to circuitry (36) on the third die (23). The multiplexing and demultiplexing of signals in the interface die (62) is carried out by mux/demux circuitry (76) in the interface die (62). The mux/demux circuitry (76) connects the signal lines (48) from the substrate to signal lines (68, 70) in the interface die. The signal lines (68) connect driver outputs to TSVs (30) and therefore to circuitry (36) in the first die (21), and the signal lines (70) connect driver outputs to PTVs (28, 29) in the first die (21) and therefore to TSVs (30) in the second die (22), to circuitry (30) in the second die (22), to PTVs (29) in the second die (22), to TSVs (30) in the third die (23), and to circuitry in the third die (23).

Alternating current signals on the signal lines (48, 52, 68, 70) are typically characterized by a clock speed. The interface die (62) can optionally operate the signal lines (68, 70) to the PTVs (28, 29) and the TSVs (30) in the first die (21) at the same clock speed as the signal lines (28) in the substrate—although such a design would potentially leave the identical dies (21, 22, 23) operating with unused data communications bandwidth. As a possibly preferred alternative, therefore, the substrate can be configured to operate the signal lines (68, 70) of the substrate at a first clock speed (63) with the interface die (62) operating signal lines (68, 70) to the PTVs (28, 29) and to the TSVs (30) at a second clock speed (67), the first clock speed sufficiently faster than the second clock speed to fit onto the signal lines (68, 70) of the interface die all communications between the substrate and the PTVs and the TSVs. In a case where, for example, the clock speed of the signal lines (48) in the substrate (26) were 1.5 GHz and the clock speed of the signals on the signal lines (68, 70) in the interface die (62) were 0.5 GHz—and the mux/demux circuitry (76) administers packets of data from the substrate—sending one-third of the packets to each of the dies (21, 22, 23)—then with these two example clock speeds, data communications from the substrate to the dies would exactly fit the bandwidth of the data communications speed available between the interface die and the other dies in the stack, thereby reducing or eliminating completely any need for additional storage buffering in the mux/demux circuitry (76) or elsewhere in the interface die (62)—and also reducing or eliminating any need for additional signal or bus lines in the substrate.

Figure 5:
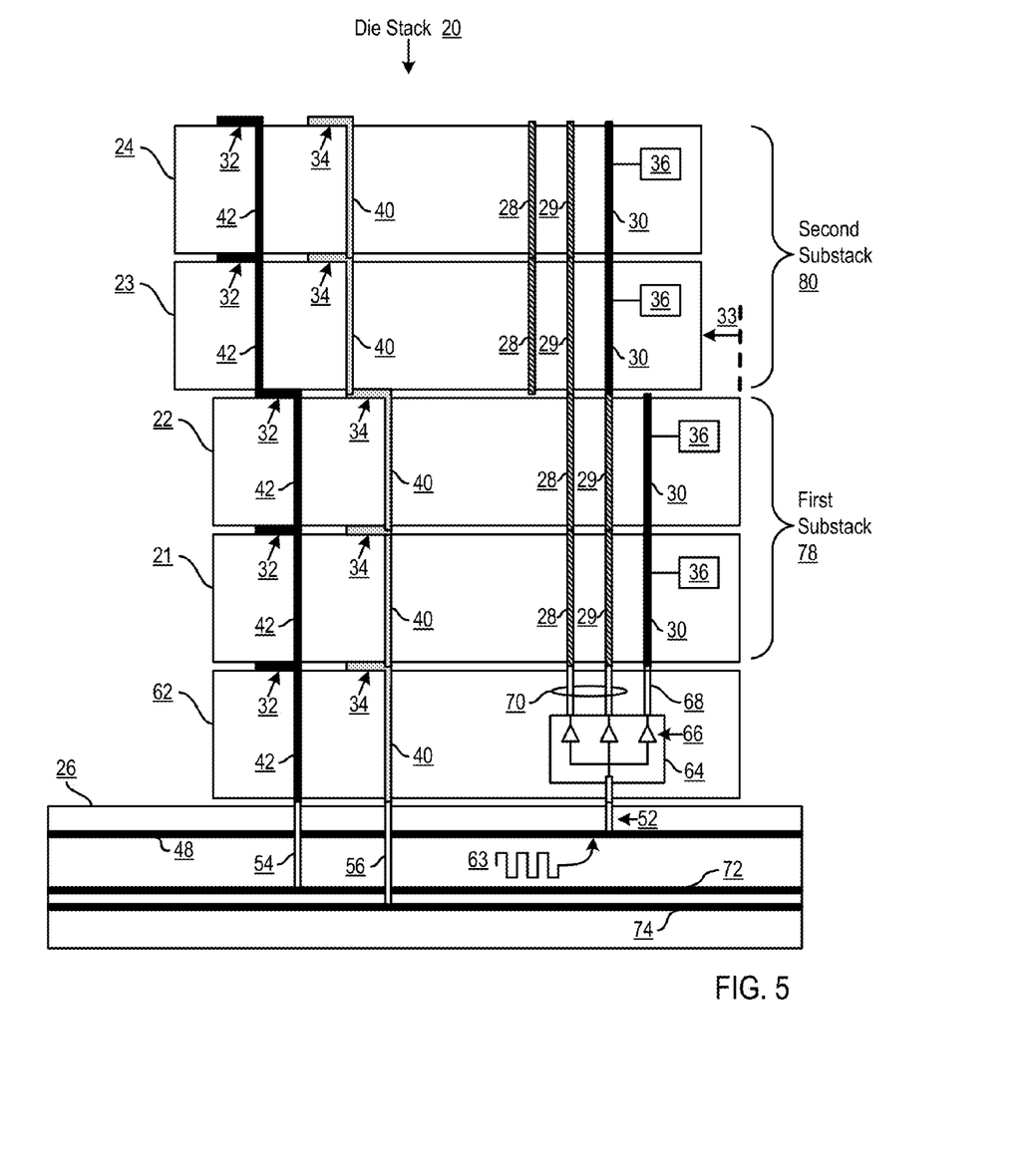
FIG. 5 sets forth a cross-sectional vertical view schematic drawing of a further example integrated circuit die stack according to embodiments of the present invention, where the die stack includes substacks.

For further explanation, FIG. 5 sets forth a cross-sectional vertical view schematic drawing of a further example integrated circuit die stack (20) according to embodiments of the present invention, where the die stack (20) includes substacks (78, 80). FIG. 5 shows dies like the dies (21, 22, 23) of FIG. 1 stacked upon a substrate (26) like the substrate (26) of FIG. 2—with the cross-section of FIG. 5 taken along line (90) on FIG. 1 and viewed from perspective (92) on FIG. 1. The example die stack of FIG. 5, however, unlike the die stack of FIG. 2, includes a first substack (78) mounted upon the substrate (26), where the first substack includes two or more (in this example, only two) identical dies (21, 22), and each of the dies (21, 22) in the first substack (78) are stacked upon one another with no shift in position with respect to one another.

The example die stack (20) of FIG. 5 also includes a second substack (80) that includes two or more dies (in this example, exactly two) (23, 24) identical to the dies (21, 22) in the first substack (78). The dies (23, 24) in the second substack (80) are stacked upon one another with no shift in position with respect to one another, although the entire second substack (80) is shifted in position (33) with respect to the first substack (78) and mounted upon the first substack so that PTVs (29) in the first substack connect the signal lines (48, 52) from the substrate (26) through the first substack (78) to TSVs (30) in the second substack (80), where the TSVs (30) in the second substack (80) drive active circuitry (36) in the dies (23, 24) of the second substack (80). Readers will recognize also that PTVs (28) in the first substack (78) connect conductors, that is, signal lines (48, 52), to PTVs (29) in the second substack (80), through which signal could be conducted to a TSVs and circuitry in a third substack—if a designer or manufacturer were to install a third substack on top of the second substack (80). Similarly, identical dies with more than two sets of PTVs (28, 29) can support installation of even more substacks, enabling creation of integrated circuit stacks in integrated circuit packages with various bus structures through the die stacks, with no need to use external wiring to connect buses up through the dies stacks, with die stacks fabricated with completely identical dies fabricated on wafers of many, many identical dies.

Figure 6:
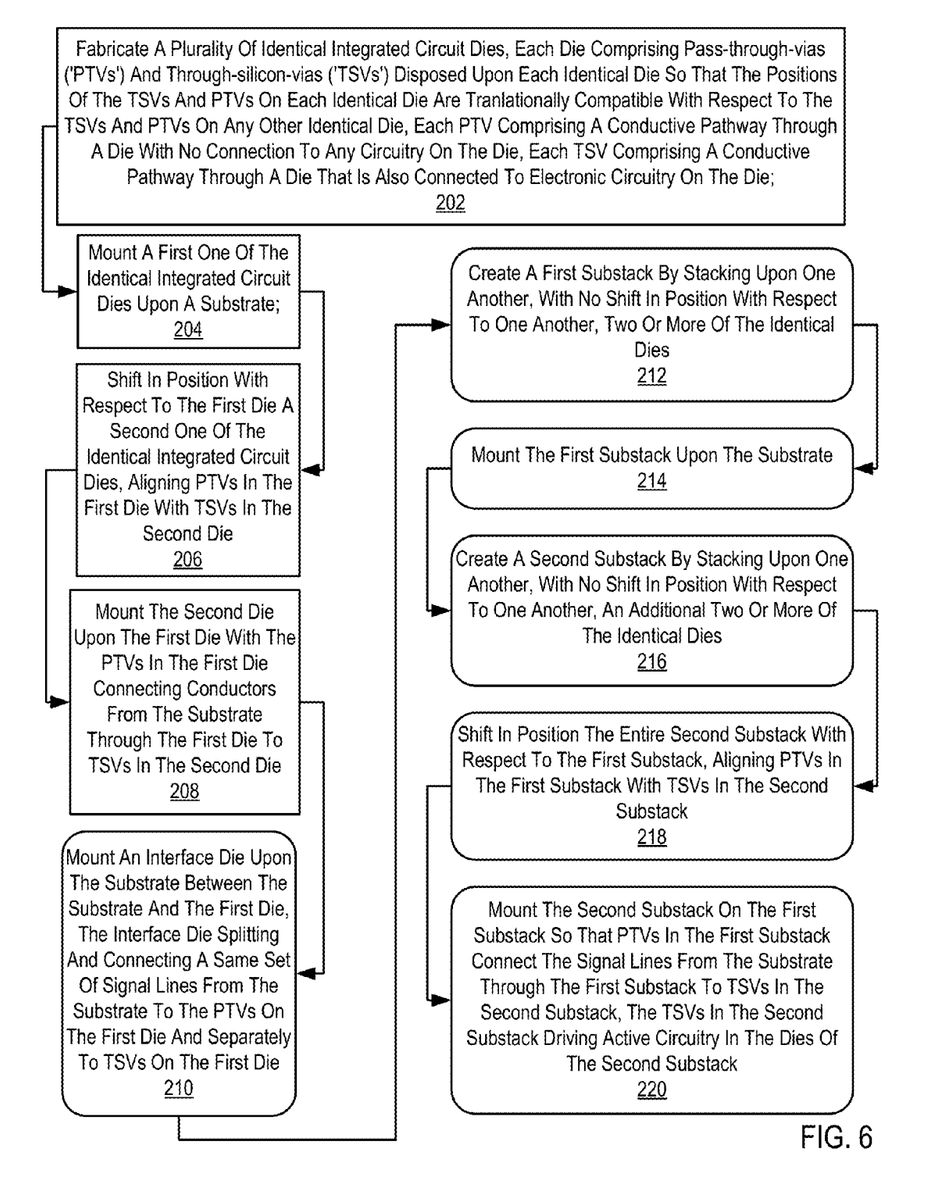
FIG. 6 sets forth a flow chart illustrating an example method of manufacturing an integrated circuit die stack according to embodiments of the present invention.

For further explanation, FIG. 6 sets forth a flow chart illustrating an example method of manufacturing an integrated circuit die stack according to embodiments of the present invention. The method of FIG. 6 fabricates integrated circuit die stacks like those described above with regard to FIGS. 1-5. For ease of explanation, therefore, the method of FIG. 6 is described here with reference to FIGS. 1-5 as well as FIG. 6, so that reference numbers in the discussion below are found not only on FIG. 6, but also on FIGS. 1-5.

The method of FIG. 6 includes fabricating (202) a plurality of identical integrated circuit dies (21, 22, 23), each die including PTVs (28, 29) and TSVs (30) disposed upon each identical die so that the positions of the TSVs and PTVs on each identical die are translationally compatible with respect to the TSVs and PTVs on any other identical die. The positions of the TSVs and PTVs are translationally compatible in the sense that the positions of at least some of the TSVs and PTVs on each identical die align when one die is shifted in position with respect to any other identical die. The method of FIG. 6 also includes mounting (204) a first one of the identical integrated circuit dies (21) upon a substrate (26), shifting in position (206) with respect to the first die a second one of the identical integrated circuit dies (22), and mounting (208) the second die (22) upon the first die (21) with PTVs (29) in the first die connecting signal lines (48) from the substrate (26) through the first die (21) to TSVs (30) in the second die (22). The example die stacks described above with regard to FIGS. 2-4 each has a third die (23) in the die stack (20), but readers will recognize that including a third die in a die stack according to embodiments of the present invention, or indeed a fourth or fifth die, is merely a matter of repeating the steps of the method of FIG. 6.

The method of FIG. 6 also includes mounting (210) an interface die (62 on FIGS. 3-6) upon the substrate (26) between the substrate and the first die (21), with the interface die (62) splitting and connecting a same set of signal lines (48) from the substrate (26) to the PTVs (28, 29) on the first die (21) and separately to TSVs (30) on the first die (21). As an alternative to a direct split of the signal lines, reference (64) on FIG. 3, the interface die can be configured to multiplex and demultiplex, reference (76) on FIG. 4, signal lines (48) from the substrate (26) to the PTVs (28, 29) on the first die (21) and separately to TSVs (30) on the first die (21), with the signal lines on the substrate (48), to the PTVs (70), and to the TSVs (68) all operating at a same clock speed. As a further alternative, the interface die (62 on FIG. 4) can be configured to multiplex and demultiplex, reference (76) on FIG. 4, signal lines (48) from the substrate with the signal lines (48) on the substrate operating at a first clock speed (63) and the interface die operating the signal lines to the PTVs (70) and to the TSVs (68) at a second clock speed (67 on FIG. 4), with the first clock speed sufficiently faster than the second clock speed to fit onto the signal lines (68, 70) of the interface die all communications between the substrate and the PTVs and the TSVs. Mounting (210) an interface die between the substrate and the first die in the die stack is depicted as an optional step in the flow chart of FIG. 6, because die stacks according to embodiments of the present invention may be fabricated with or without interface dies.

The method of FIG. 6 also includes creating (212) a first substack (78 on FIG. 5) by stacking upon one another, with no shift in position with respect to one another, two or more of the identical dies (21, 22), and mounting (214) the first substack (78) upon the substrate (26). In the particular example of FIG. 5, the die stack (20) includes an interface die (62) mounted between the substrate (26) and the first substack (78), but readers will recognize that the first substack can be mounted with its first die directly on the substrate as illustrated and discussed above with reference to die (21) in the example die stack of FIG. 2. The method of FIG. 6 also includes creating (216) a second substack (80) by stacking upon one another, with no shift in position with respect to one another, an additional two or more of the identical dies (23, 24 on FIG. 5), and shifting in position (218) the entire second substack with respect to the first substack. The positions of the PTVs, TSVs, power lines, and common lines on all the identical dies are translationally compatible with one another. The method of FIG. 6 also includes mounting (220) the second substack (80) on the first substack (78) so that PTVs (29) in the first substack connect the signal lines (48) from the substrate (26) through the first substack (78) to TSVs (30) in the second substack (80), where the TSVs (30) in the second substack drive active circuitry (36) in the dies (23, 24 on FIG. 5) of the second substack (80). Steps (212, 214, 216, 218, 220) are depicted in the flow chart of FIG. 6 as optional because die stacks according to embodiments of the present invention may be implemented with or without substacks. A die stack containing only two identical dies shifted in position with respect to one another, as in the die stack of FIG. 2, contains no substacks—it being taken as trivial here to speak of a 'substack' as containing only one die. That is, a 'substack' as the term is used here contains at least two dies, not shifted in position with respect to one another.

Figure 7:
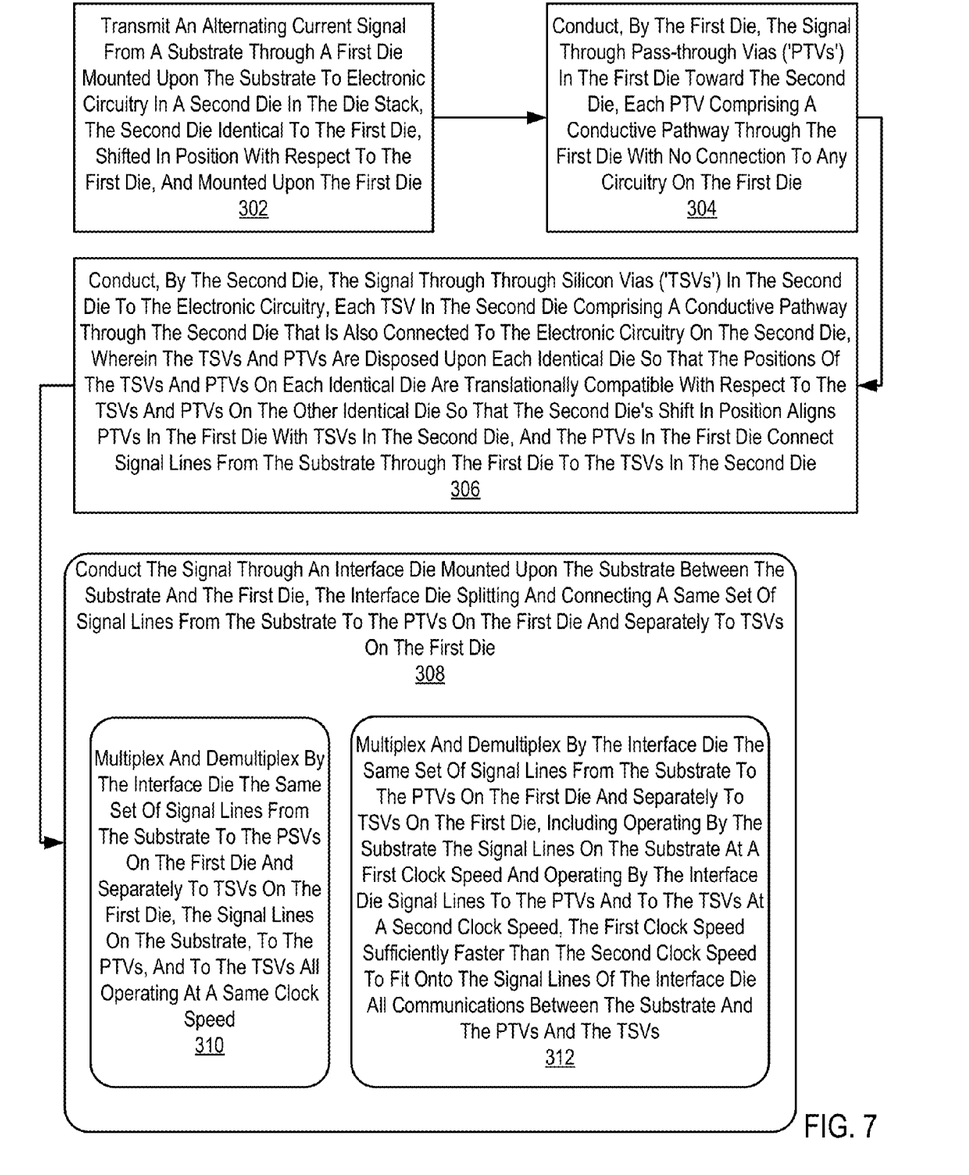
FIGS. 7-8 set forth flow charts illustrating example methods of operation for an integrated circuit die stack according to embodiments of the present invention.

For further explanation, FIG. 7 sets forth a flow chart illustrating an example method of operation for an integrated circuit die stack (20) according to embodiments of the present invention. The method of FIG. 7 operates integrated circuit die stacks like those described above with regard to FIGS. 1-5. For ease of explanation, therefore, the method of FIG. 7 is described here with reference to FIGS. 1-5 as well as FIG. 7, so that reference numbers in the discussion below are found not only on FIG. 7, but also on FIGS. 1-5.

With reference also to FIGS. 1-2: The method of FIG. 7 includes transmitting (302) an alternating current signal (63) from a substrate (26) through a first die (21) mounted upon the substrate to electronic circuitry (36) in a second die (22) in the die stack (20), where the second die is identical to the first die, shifted in position with respect to the first die, and mounted upon the first die. The method of FIG. 7 also includes conducting (304), by the first die (21), the signal (63) through PTVs (29) in the first die toward the second die, where each PTV (28, 29) is composed of a conductive pathway through the first die with no connection to any circuitry on the first die. The method of FIG. 7 also includes conducting (306), by the second die (22), the signal (63) through TSVs (30) in the second die to the electronic circuitry (36), where each TSV in the second die is composed of a conductive pathway through the second die that is also connected to the electronic circuitry on the second die. The TSVs (30) and PTVs (28, 29) are disposed upon each identical die so that the positions of the TSVs and PTVs on each identical die are translationally compatible with respect to the TSVs and PTVs on the other identical die, and some of the PTVs (29) in the first die connect signal lines (48) from the substrate (26) through the first die to the TSVs (30) in the second die.

With reference also to FIG. 4: The method of FIG. 7 also includes conducting (308) the signal (63) through an interface die (62) mounted upon the substrate (26) between the substrate and the first die (21), where the interface die splits and connects (68, 70) a same set of signal lines (48, 52) from the substrate to the PTVs (28, 29) on the first die (21) and separately to TSVs (30) on the first die (21). The method of FIG. 7 also includes the alternative option of multiplexing and demultiplexing (310) by the interface die (26) the same set of signal lines (48) from the substrate (26) to the PTVs (28, 29) on the first die (21) and separately to TSVs (30) on the first die (21), with the signal lines on the substrate (48), to the PTVs (70), and to the TSVs (68) all operating at a same clock speed. As a further optional alternative, the method of FIG. 7 also includes multiplexing and demultiplexing (312) by the interface die (26) the same set of signal lines (48) from the substrate (26) to the PTVs (28) on the first die (21) and separately to TSVs (30) on the first die (21), including operating by the substrate (26) the signal lines (48) on the substrate (26) at a first clock speed (63) and operating by the interface die signal lines (68, 70) to the PTVs (28, 29) and to the TSVs (30) at a second clock speed (67), where the first clock speed is sufficiently faster than the second clock speed to fit onto the signal lines (68, 70) of the interface die (62) all communications between the substrate (26) and the PTVs (28, 29) and the TSVs (30). The steps of conducting (308) the signal through an interface die as well multiplexing and demultiplexing (310, 312) the signal by the interface die are depicted as optional steps in the flow chart of FIG. 7, because die stacks according to embodiments of the present invention may be operated with or without interface dies.

Figure 8:
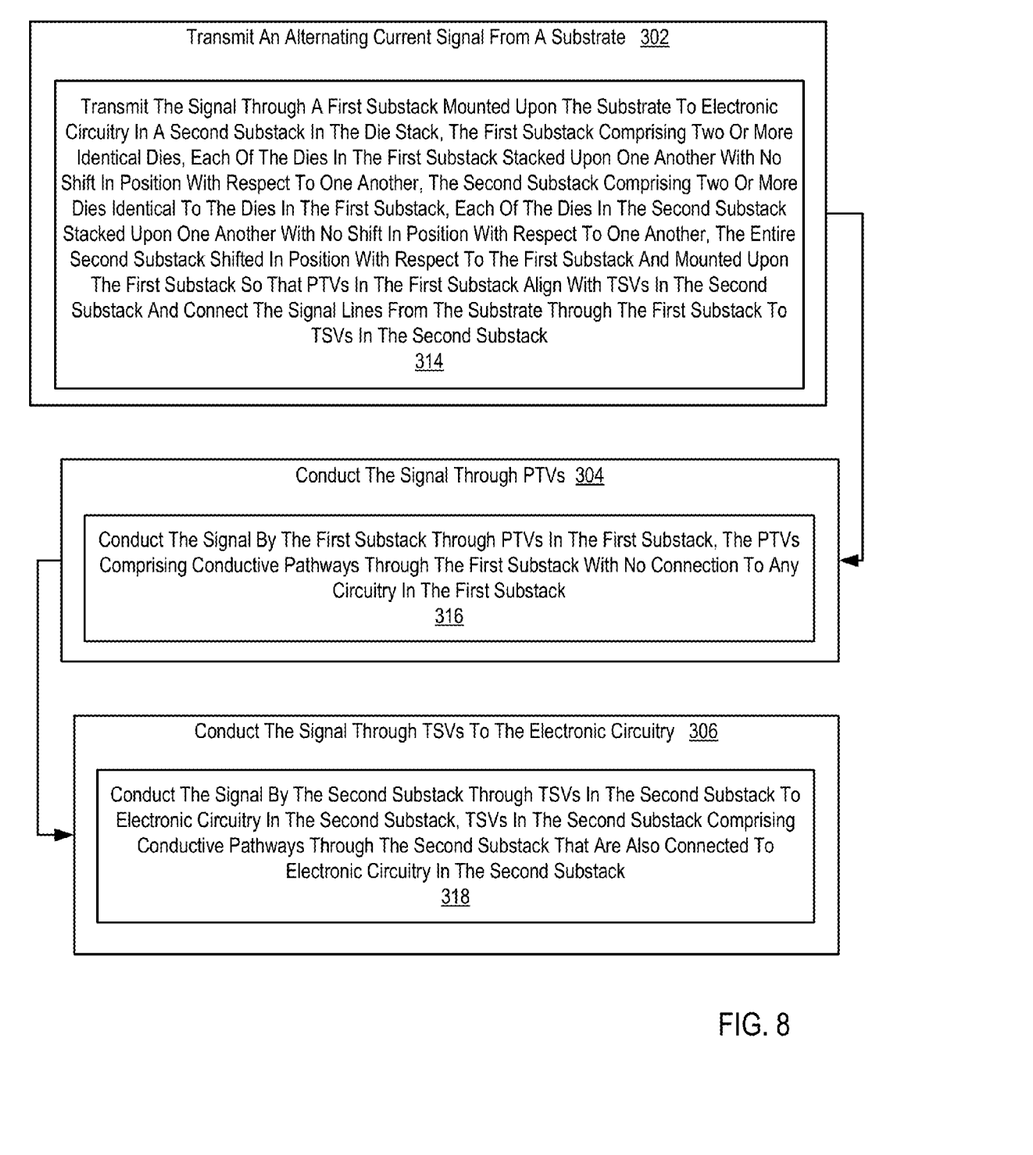

For further explanation, FIG. 8 sets forth a flow chart illustrating a further example method of operation for an integrated circuit die stack according to embodiments of the present invention. The method of FIG. 8 operates integrated circuit die stacks like those described above with regard to FIGS. 1-5. For ease of explanation, therefore, the method of FIG. 8 is described here with reference to FIGS. 1-5 as well as FIG. 8, so that reference numbers in the discussion below are found not only on FIG. 8, but also on FIGS. 1-5. The method of FIG. 8 is similar to the method of FIG. 7, including as it does transmitting (302) an alternating current signal from a substrate, conducting (304) the signal through PTVs, and conducting (306) the signal through TSVs to electronic circuitry.

With reference also to FIG. 5: Transmitting (302) an alternating current signal (63) from a substrate in the method of FIG. 8, however, unlike the method of FIG. 7, includes transmitting (314) the signal (63) through a first substack (78) mounted upon the substrate (26) to electronic circuitry (36) in a second substack (80) in the die stack (20). The first substack (78) includes two or more identical dies (21, 22 on FIG. 5), and each of the dies in the first substack are stacked upon one another with no shift in position with respect to one another. The second substack (80) includes two or more dies (23, 24 on FIG. 5) identical to the dies in the first substack, also with each of the dies in the second substack stacked upon one another with no shift in position with respect to one another. The entire second substack (80), however, is shifted in position (33) with respect to the first substack (78) and mounted upon the first substack so that PTVs (29) in the first substack connect the signal lines (48) from the substrate through the first substack to TSVs (30) in the second substack (80).

Also in the method of FIG. 8, conducting (304) the signal through PTVs includes conducting (316) the signal (63) by the first substack (78) through PTVs (29) in the first substack, where the PTVs are conductive pathways through the first substack with no connection to any circuitry in the first substack. Also in the method of FIG. 8, conducting (306) the signal (63) through TSVs (30) includes conducting (318) the signal by the second substack (80) through TSVs (30) in the second substack to electronic circuitry (36) in the second substack, where the TSVs (30) in the second substack are composed of conductive pathways through the second substack that are also connected to electronic circuitry (36) in the second substack (80).

In view of the explanations set forth above, readers will recognize that the benefits of integrated circuit die stack with translationally compatible vias according to embodiments of the present invention include:

Substantial reduction of bus signal lines load when stacking multiple dies, hence easier impedance matching, better control of bus noise, Higher signal quality on the vias in the dies of a stack, Support for faster bus speeds on the vias in the dies of a stack, Flexible support for bus structures completely internal to the die stack, with no requirement whatsoever for external wiring to connect signals, common, or power up through the stack, and Flexible support for multiple different bus structures in die stacks, despite the fact that all the dies in a die stack, with the optional exception of an interface die, are identical.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An integrated circuit die stack comprising:
a first die mounted upon a substrate, the first die comprising pass-through vias ('PTVs'), each PTV comprising a conductive pathway through the first die with no connection to any circuitry on the first die;
a second die, identical to the first die, shifted in position with respect to the first die and mounted upon the first die so that the PTVs in the first die connect conductors from the substrate through the first die to the TSVs in the second die, each TSV on the second die comprising a conductive pathway through the second die that is also connected to electronic circuitry on the second die, the TSVs and PTVs disposed upon each identical die with the positions of the TSVs and PTVs on each identical die translationally compatible with respect to the TSVs and PTVs on the other identical die so that the second die's shift in position aligns PTVs in the first die with TSVs in the second die; and
an interface die, the interface die multiplexing and demultiplexing a same set of signal lines from the substrate to the PTVs on the first die and separately to the TSVs on the first die.

2. The die stack of claim 1 wherein the conductors from the substrate comprise power lines, common lines, and signal lines.

3. The die stack of claim 1
wherein the interface die is mounted upon the substrate between the substrate and the first die splitting and connecting the same set of signal lines from the substrate to the PTVs on the first die and separately to the TSVs on the first die.

4. The die stack of claim 1,
wherein the signal lines on the substrate, to the PTVs, and to the TSVs all operate at a same clock speed.

5. The die stack of claim 1 wherein:
the interface die operates the signal lines on the substrate at a first clock speed and the signals lines to the PTVs and to the TSVs at a second clock speed, the first clock speed sufficiently faster than the second clock speed to fit onto the signal lines of the substrate all communications between the interface die and the PTVs and the TSVs.

6. The die stack of claim 1 further comprising:
a first substack mounted upon the substrate, the first substack comprising two or more dies identical to the first die, each of the dies in the first substack stacked upon one another with no shift in position with respect to one another; and
a second substack comprising two or more dies identical to the dies in the first substack, each of the dies in the second substack stacked upon one another with no shift in position with respect to one another, the entire second substack shifted in position with respect to the first substack and mounted upon the first substack so that PTVs in the first substack connect the conductors from the substrate through the first substack to TSVs in the second substack.

7. A method of manufacturing an integrated circuit die stack comprising:
fabricating a plurality of identical integrated circuit dies, each die comprising pass-through-vias ('PTVs') and through-silicon-vias ('TSVs') disposed upon each identical die so that the positions of the TSVs and PTVs on each identical die are translational compatible with respect to the TSVs and PTVs on any other identical die, each PTV comprising a conductive pathway through a die with no connection to any circuitry on the die, each TSV comprising a conductive pathway through a die that is also connected to electronic circuitry on the die;
mounting a first one of the identical integrated circuit dies upon a substrate;
shifting in position with respect to the first die a second one of the identical integrated circuit dies, aligning PTVs in the first die with TSVs in the second die;
mounting the second die upon the first die with the PTVs in the first die connecting conductors from the substrate through the first die to TSVs in the second die; and
mounting an interface die upon the substrate between the substrate and the first die, the interface die multiplexing and demultiplexing a same set of signal lines from the substrate to the PTVs on the first die and separately to the TSVs on the first die.

8. The method of claim 7 wherein the conductors from the substrate comprise power lines, common lines, and signal lines.

9. The method of claim 7
wherein the interface die splits and connects the same set of signal lines from the substrate to the PTVs on the first die and separately to TSVs on the first die.

10. The method of claim 7,
wherein the signal lines on the substrate, to the PTVs, and to the TSVs all operate at a same clock speed.

11. The method of claim 7
wherein the substrate operates the signal lines on the substrate at a first clock speed and the interface die operates the signal lines to the PTVs and to the TSVs at a second clock speed, the first clock speed sufficiently faster than the second clock speed to fit onto the signal lines of the interface die all communications between the substrate and the PTVs and the TSVs.

12. The method of claim 7 further comprising:
creating a first substack by stacking upon one another, with no shift in position with respect to one another, two or more of the identical dies;
mounting the first substack upon the substrate;
creating a second substack by stacking upon one another, with no shift in position with respect to one another, an additional two or more of the identical dies;
shifting in position the entire second substack with respect to the first substack, aligning PTVs in the first substack with TSVs in the second substack; and
mounting the second substack on the first substack so that PTVs in the first substack connect the conductors from the substrate through the first substack to TSVs in the second substack, the TSVs in the second substack driving active circuitry in the dies of the second substack.

13. A method of operation for an integrated circuit die stack comprising:
transmitting an alternating current signal from a substrate through a first die mounted upon the substrate to electronic circuitry in a second die in the die stack, the second die identical to the first die, shifted in position with respect to the first die, and mounted upon the first die;
conducting, by the first die, the signal through pass-through vias ('PTVs') in the first die toward the second die, each PTV comprising a conductive pathway through the first die with no connection to any circuitry on the first die;
conducting, by the second die, the signal through silicon vias ('TSVs') in the second die to the electronic circuitry, each TSV in the second die comprising a conductive pathway through the second die that is also connected to the electronic circuitry on the second die, wherein the TSVs and PTVs are disposed upon each identical die so that the positions of the TSVs and PTVs on each identical die are translationally compatible with respect to the TSVs and PTVs on the other identical die so that the second die's shift in position aligns PTVs in the first die with TSVs in the second die, and the PTVs in the first die connect signal lines from the substrate through the first die to the TSVs in the second die; and
multiplexing and demultiplexing by an interface die a same set of signal lines from the substrate to the PTVs on the first die and separately to the TSVs on the first die.

14. The method of claim 13 wherein the conductors from the substrate comprise power lines, common lines, and signal lines.

15. The method of claim 13
conducting the signal through the interface die mounted upon the substrate between the substrate and the first die, wherein the interface die splits and connects the same set of signal lines from the substrate to the PTVs on the first die and separately to the TSVs on the first die.

16. The method of claim 13,
wherein the signal lines on the substrate, to the PTVs, and to the TSVs all operate at a same clock speed.

17. The method of claim 15 further comprising:
wherein multiplexing and demultiplexing by the interface die the same set of signal lines from the substrate to the PTVs on the first die and separately to the TSVs on the first die includes operating the substrate the signal lines on the substrate at a first clock speed and operating signal lines to the PTVs and to the TSVs at a second clock speed, the first clock speed sufficiently faster than the second clock speed to fit onto the signal lines of the interface die all communications between the substrate and the PTVs and the TSVs.

18. The method of claim 13 wherein:
transmitting an alternating current signal from a substrate further comprises transmitting the signal through a first substack mounted upon the substrate to electronic circuitry in a second substack in the die stack, the first substack comprising two or more identical dies, each of the dies in the first substack stacked upon one another with no shift in position with respect to one another, the second substack comprising two or more dies identical to the dies in the first substack, each of the dies in the second substack stacked upon one another with no shift in position with respect to one another, the entire second substack shifted in position with respect to the first substack and mounted upon the first substack so that PTVs in the first substack align with TSVs in the second substack and connect the signal lines from the substrate through the first substack to TSVs in the second substack;
conducting the signal through PTVs further comprises conducting the signal by the first substack through PTVs in the first substack, the PTVs comprising conductive pathways through the first substack with no connection to any circuitry in the first substack; and
conducting the signal through TSVs further comprises conducting the signal by the second substack through TSVs in the second substack to electronic circuitry in the second substack, TSVs in the second substack comprising conductive pathways through the second substack that are also connected to electronic circuitry in the second substack.

* * * * *